United States Patent [19]

Dehaine

[11] Patent Number: 5,057,456

[45] Date of Patent: Oct. 15, 1991

[54] METHOD OF MANUFACTURING A TAB SEMICONDUCTOR PACKAGE BY SECURING A THIN INSULATING FRAME TO INNER LEADS OF THE PACKAGE

[75] Inventor: Gerard Dehaine, Chatillon, France

[73] Assignee: Bull, S.A., Paris, France

[21] Appl. No.: 396,690

[22] Filed: Aug. 22, 1989

[30] Foreign Application Priority Data

Aug. 23, 1988 [FR] France ................. 88 11107

[51] Int. Cl.⁵ ................. H01L 21/60; H01L 21/58
[52] U.S. Cl. ..................... 437/206; 437/220
[58] Field of Search ........... 437/206, 220; 206/330; 264/DIG. 61; 357/70; 361/398, 400, 403, 406, 408, 421

[56] References Cited

U.S. PATENT DOCUMENTS

| | | |
|---|---|---|
| 3,832,769 | 9/1974 | Olyphant, Jr. et al. ............. 357/80 |
| 3,838,984 | 10/1974 | Crane et al. ............. 357/80 |
| 4,435,740 | 3/1984 | Huckabee et al. . |
| 4,731,645 | 3/1988 | Parmentier et al. . |

FOREIGN PATENT DOCUMENTS

| | | | |
|---|---|---|---|
| 0080041 | 6/1983 | European Pat. Off. . | |
| 0094716 | 11/1983 | European Pat. Off. . | |
| 56-69850 | 6/1981 | Japan ................. | 437/215 |
| 58-34934 | 3/1983 | Japan ................. | 437/220 |
| 60-35527 | 2/1985 | Japan ................. | 437/206 |
| 60-113932 | 6/1985 | Japan ................. | 437/220 |
| 62-216337 | 9/1987 | Japan ................. | 437/206 |
| 62-272546 | 11/1987 | Japan ................. | 437/206 |

OTHER PUBLICATIONS

Patent Abstracts of Japan, vol. II, NO. 209 (E-52]) (E-521) (2656) Jul. 7, 1987.
Patent Abstracts of Japan JP-A-62 30 342 (NEC Corp.) 09-02-1987.

Primary Examiner—Olik Chaudhuri
Assistant Examiner—David E. Graybill
Attorney, Agent, or Firm—Kerkam, Stowell, Kondracki & Clarke

[57] ABSTRACT

On the TAB package (10) including a TAB spider (13) glued to a preformed substrate (15) and provided with leads (12) the ILB ends of which rest on an insulating frame (20), this frame is an element directly mounted on the leads, which is independent of the substrate and has a thickness substantially less than that of the substrate.

20 Claims, 2 Drawing Sheets

METHOD OF MANUFACTURING A TAB SEMICONDUCTOR PACKAGE BY SECURING A THIN INSULATING FRAME TO INNER LEADS OF THE PACKAGE

FIELD OF THE INVENTION

The invention relates to a very large scale integrated circuit package, and a method for its manufacture.

BACKGROUND OF THE INVENTION

At present, very large scale integrated circuits, currently known as VLSI circuits or chips, are substantially square small fine plates of semiconductor material, over 1 cm long on each side, provided with a great number—on the order of 300 to 400—of input/output terminals. In tape-automated bonding technology (TAB), each integrated circuit is mounted on a package, which comprises an insulating substrate including a window, with a bundle of leads overhanging the substrate and converging in the window. The input/output terminals of the integrated circuit are fixed by an operation known as inner lead bonding (ILB) in the window of the substrate, at the free ends of the leads. These terminals are in fact placed on the periphery of the integrated circuit, in a line or in zig-zag fashion. In current terminology, the package is called a TAB package, the bundle of leads a spider, the leads themselves the legs of the spider, and their inner ends the ILB ends. Ordinarily, the insulating substrate of the package is a flexible tape similar to motion-picture film, which is provided with successive windows for connection of the integrated circuits and lateral perforations for tape displacement and positioning.

It is presently possible for the spacing of the input/output terminals on a VLSI chip to be as close as less than 100 micrometers. Hence the leads for an integrated circuit of this kind are necessarily quite narrow and very close to one another. To rigidify them and assure that they are equidistant in the course of the various manipulations of the package and spider, the leads inside a window are generally supported by at least one insulating frame originating in the substrate of the package. A frame of this kind is currently available to support the ILB ends of the leads of a spider. In one case, the ILB operation is done near the frame, which rests on the integrated circuit. Otherwise, the frame is pierced with holes under the leads, for their ILB connection to the corresponding terminals of the integrated circuit. In both cases, the leads are separated from the corresponding terminals of the integrated circuit by a height equal to the thickness of the ILB frame. Consequently, the ILB connection is generally done with beads, which are currently made of a soldering material such as tin-lead alloy and of sufficient height to compensate for the thickness of the ILB frame, that are fixed or deposited on the input/output terminals of the integrated circuit. The problem presented by this frame in ILB soldering to the terminals of a VLSI chip has been solved up to now by a sophisticated method of manufacturing a TAB package.

A conventional TAB package is made by engraving a sheet of copper glued to a preformed substrate. This package accordingly comprises three layers: copper - adhesive - substrate. Ordinarily, the copper foil has a thickness of approximately 15 to 70 $\mu$m, the glue is acrylic or epoxy spread over a thickness of approximately 25 $\mu$m, and the substrate is a film of the motion-picture type, made of a flexible and electrically insulating material (such as kapton, Mylar(®), epoxy, etc.), the minimum thickness of which is about 50 82 m and currently is on the order of 100 $\mu$m. All the openings in the substrate are made by mechanical cutting operations, such as punching. The ILB frame, formed by cutting a window in the substrate, is necessarily supported by the substrate, actually on arms disposed along the diagonals of the window. This package is not very expensive and its substrate is sufficiently thick to maintain considerable rigidity when it is large in size, that is, larger than 50 mm on a side. However, because its substrate is preformed by mechanical cutting, it it unusable for the very large scale density of spiders in current use. The ILB frame is made by cutting of the substrate and thus has the same thickness, hence 50 $\mu$m at minimum, to obtain the requisite qualities of the package. It follows that each bead of solder necessary for fixing one lead of the spider to the corresponding terminal of the integrated circuit must have a thickness greater than the thickness of the package, and hence greater than 50 $\mu$m. Such large beads cannot be made except on large terminals, and they require the piercing of large holes, which conflicts with the large scale integration desired for connecting the leads to an integrated circuit. Moreover, piercing of large holes in an ILB frame can be done on an industrial scale only by punching, which has the disadvantage of piercing holes of at least 600 to 800 $\mu$m in diameter. It has proved impossible to adapt a standard TAB package to a spider for large scale integration.

The solution currently used for this problem resides in manufacturing a TAB package in two layers: copper and substrate. By this method, on a thin substrate approximately 20 $\mu$m thick of insulating material—ordinarily, polyimide—a fine film of copper is deposited uniformly in a vacuum (generally by the intermediary of a bonding layer, for instance of chromium), which is then grown selectively by electrochemical means to form the TAB spider. The film of copper is removed except for the pattern of the spider, and then the substrate is engraved, which is made possible by its thinness. The engraving comprises for instance depositing on the substrate a film of silicon dioxide ($SiO_2$), which is engraved with the aid of a film of photoresist, to serve as a mask in the oxygen plasma engraving of the polyimide substrate. The oxygen plasma attacks only the organic material, in other words the photoresist and the polyimide, but has the disadvantage of a relatively long penetration time, on the order of 1 $\mu$m per minute. It will be understood that this method is unsuitable for industrial use with thick substrates. Contrarily, this method is quite suitable for thin substrates. In that case, the frames and particularly the ILB frame no longer need to be attached by arms to the rest of the substrate. In the case where the ILB frame must be pierced under the leads, the holes are advantageously made at the time the substrate is engraved with the oxygen plasma and can thus have a diameter of less than 100 $\mu$m. The slight thickness of the ILB frame enables the ILB connection to be made by the intermediary of small beads of solder, which are adapted to the present very large scale of integration of these circuits, and the small perforations engraved in the frame are no longer obstacles to the large scale of integration desired. However, such a package costs about three times as much as a conventional package, and it proves to be difficult to use for large substrates, more than 70 mm on a side, for example, because its thinness means that the substrate is very highly flexible.

SUMMARY OF THE INVENTION

The object of the present invention is to adapt a conventional package, which is relatively inexpensive and is always easy to use, to current very large scale integrated chips.

A TAB package according to the invention, including a TAB spider glued to a preformed substrate and provided with leads, the ILB ends of which rest on an insulating frame, is characterized in that the frame is an element mounted directly on the leads, which is independent of the substrate and the thickness of which is substantially less than that of the substrate.

A method according to the invention for manufacturing the TAB package, including the fixation via an adhesive layer of a conductive metal foil on a preformed insulating substrate and the engraving of the metal foil to comprise at least one TAB spider provided with ILB ends on the inside of a window of the substrate, is characterized in that it includes the fixation, on the ILB ends of the TAB spider, of an insulating frame having a thickness substantially less than the thickness of the substrate.

The characteristics and advantages of the invention will become apparent from the ensuing detailed description, provided by way of example and taken in conjunction with the accompanying drawings.

DESCRIPTION OF THE PREFERRED EMBODIMENTS

Figure 1:
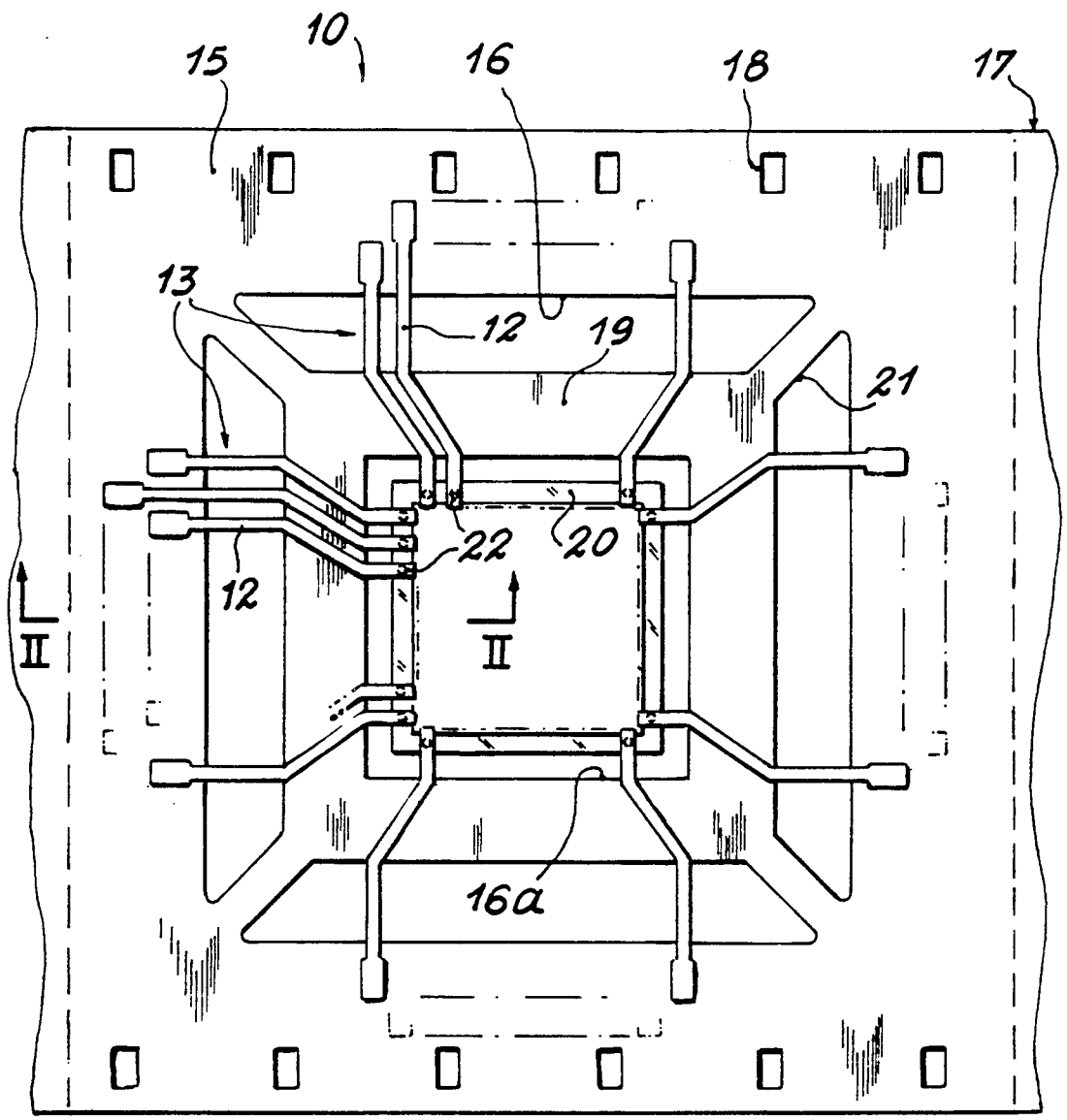
FIG. 1 is a top view, partially omitting the leads, of a TAB package according to the invention, intended for a VLSI chip.
Figure 2:
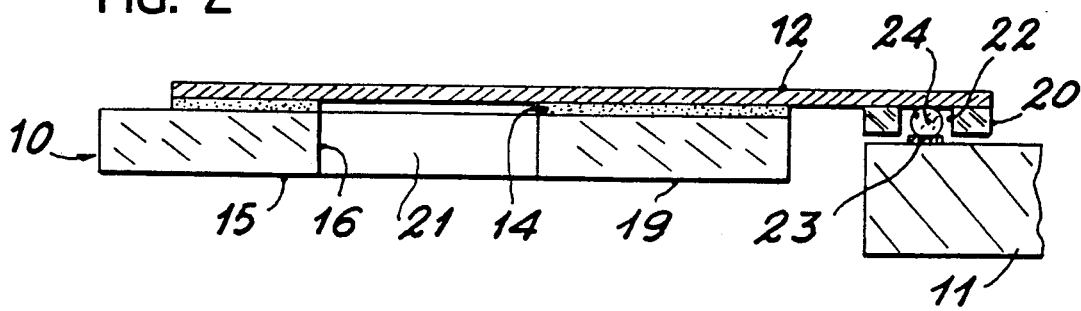
FIG. 2 is a fragmentary sectional view along the line II—II of the package shown in FIG. 1, provided with a VLSI chip.
Figure 3A:
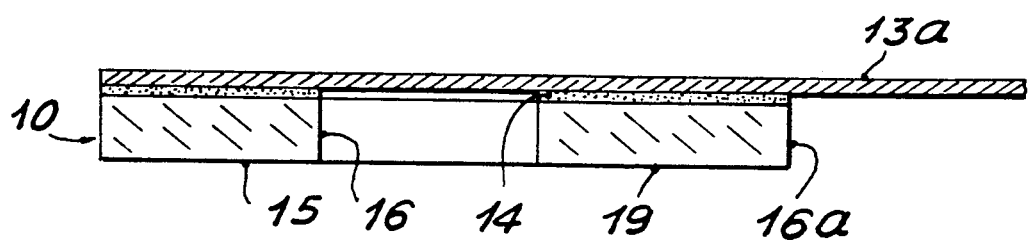
FIGS. 3A and 3B are views similar to that of FIG. 2, showing two prior steps in a method according to the invention for manufacturing the package shown in FIGS. 1 and 2.

FIGS. 1 and 2 show a TAB package 10 according to the invention, adapted for the connection of a VLSI chip 11. The package 10 is of the conventional type, including leads 12 disposed in a bundle known as a TAB spider 13 and fixed via an adhesive layer 14 on one side of a preformed substrate 15, which is made of a flexible and electrically insulating material. The leads 12 of the spider 13 are disposed overhanging the periphery of a window 16 of the substrate 15, which has been cut along the dashed lines on the sides of FIG. 1 from a TAB film 17 of the motion-picture film type. The package 10 thus has lateral perforations 18 of the film 17, which serve to displace and position the package 10. In the window 16, the leads 12 of the spider 13 are carried by two frames 19, 20. The frame 19 extends as far as half the distance of the overhanging length of the leads 12 of the spider 13 in the window 16. The window 16 and the frame 19 have been formed mechanically cutting of the substrate 15 before it included the spider 13. FIG. 3A shows the thus preformed substrate 15. Hence the frame 19 has the same thickness and is of the same material as the substrate 15 and is attached to it by arms 21 left behind when the film 17 was cut and aligned along the diagonal of the window 16. The window 16a formed by the inside walls of the frame 19 is merely an extension of the substrate 15. As shown in FIG. 2, the spider 13 is also affixed via the adhesive layer 14 to the frame 19. The frame 20 unites all the ends of the leads 12 and is pierced with holes 22 under the respective leads 12 so it can be connected to the terminals 23 of the integrated circuit 11 via beads of solder 24, for instance, of tin-lead alloy. In practice, the beads 24 are ordinarily formed or fixed to the terminals of the integrated circuit 11 in a standard manner, and then are introduced into the holes 22 of the frame 20 as shown in FIG. 2. In the prior art, the frame 20 was similar to the frame 19 and thus was necessarily attached to the frame 19 via arms aligned along the diagonals of the frame 19.

Figure 3B:
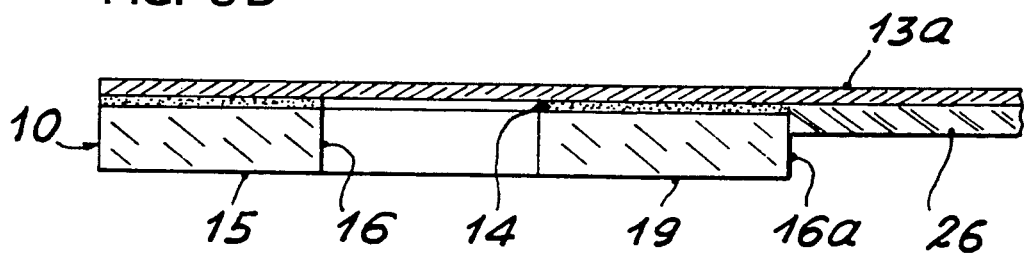

In the invention, the frame 20 is an element that is mounted directly on the ILB ends of the leads 12 in the window 16a, is independent of the substrate 15 and has a thickness substantially less than that of the substrate. FIGS. 3A and 3B are views similar to that of FIG. 2, showing two steps of the preferred method for making the frame 20 to obtain a package 10 according to the invention. In these figures, the preformed package 15 has been covered with a uniform metal foil 13a which will later serve to form the TAB spider 13. In the window 16a formed by the frame 19, a layer 26 of photosensitive insulating material in liquid form has been applied directly to the uniform metal foil 13a, being spread over a thickness substantially less than the thickness of the substrate 15. In practice, photopolyimide was applied by atomization over a thickness of 30 μm, while the thickness of the substrate was 100 μm. The frame 20 and its holes 22, such as those shown in FIGS. 1 and 2, were obtained by photoengraving of the layer 26. Next, the engraving of the metal foil 13a is done, to form the TAB spider 13. In a variant, the foil 13a may be engraved before the layer 26 is engraved.

A package 10 according to the invention can be obtained by methods different from the one shown. A first such method may be a variant of that method. In particular, the photopolyimide may be applied by other means than atomization. One known method is to spread it by rotation (the spin-on method). This material is new on the market at present, and not all of its characteristics and advantages have yet been learned. For example, the serigraph may advantageously be applied to the already-formed spider 13. In another variant, the photosensitive insulating material of the layer 26 is the material normally used to define a soldering zone on a lead and is generally known as solder resist. For extremely high density or scale of integration, the holes 22 may be made later, not by photoengraving of the layer 26 but by some method making it possible to obtain holes of very slight diameter, such as piercing by laser beam.

Figure 4:
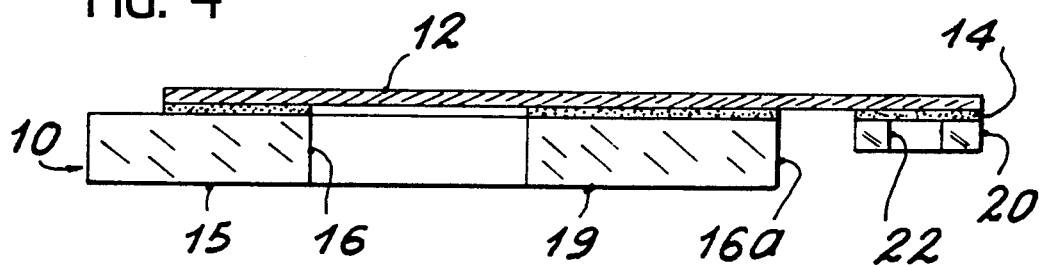
FIG. 4 is a view similar to that of FIG. 2, showing a variant embodiment of a TAB package according to the invention.

Additionally, the frame 20 may be made not directly on the spider, as shown in FIGS. 3A and 3B, but at a distance from the package 10 and then mounted directly on the spider 13 and fixed to it. FIG. 4 shows a TAB package 10 according to the invention obtained by this variant embodiment. In FIG. 4, the spider 13, the substrate 15 and the frame 19 have been made in the conventional manner, while the frame 20 was made independently, at a distance from the package 10. In practice, a thin foil of polyimide, 25 μm in thickness, was used, engraved by exposure to an oxygen plasma to obtain the frame 20 and to pierce the holes 22. The frame 20 was mounted directly on the spider 13 and fixed to it via an adhesive layer 14 identical to the layer glueing the spider 13 to the substrate 15.

Several variants of this method may be used to make the frame 20 independently of a package 10 made in the standard manner, to fix it to the package 10, and to form the holes 22. In particular, the frame 20 may be fixed directly to the spider 13, by local heating, for instance by ultrasound, and the holes 22 may be pierced, for example by laser, before or after the fixation of the frame 20. It is thus apparent that the frame 20 may be mounted directly on the spider 13 during the conventional manufacture of the package 10, for example prior to the engraving of the spider 13 mounted on the substrate 15.

What is claimed is:

1. A method of manufacturing a TAB package, comprising: preforming an insulating substrate having an open window therein, fixing a conductive metal foil to the preformed insulating substrate via an adhesive layer, applying directly to the metal foil in at least a central region of the window a layer of photosensitive insulating material of a thickness less than the thickness of said substrate, photoengraving said layer to form an insulating frame means, and engraving the metal foil to form a TAB lead frame comprising leads having inner ends secured to said insulating frame means inside the window of the substrate and said inner ends being adapted to be connected to respective pads of an integrated circuit.

2. The method as defined by claim 1, wherein said photoengraving step further comprises forming means in said insulating frame means for permitting the connection of the inner ends to the respective pads of the integrated circuit.

3. The method as defined by claim 1, further comprising forming means in said insulating frame means for permitting the connection of the inner ends to the respective pads of the integrated circuit, and wherein said forming step is conducted after said photoengraving step.

4. The method as defined by claim 2, wherein said means in said insulating frame means are through holes corresponding to respective inner ends of the TAB lead frame.

5. The method as defined by claim 3, wherein said means in said insulating frame means are through holes corresponding to respective inner ends of the TAB lead frame.

6. The method as defined by claim 1, wherein the steps of applying and photoengraving said layer are made subsequently to said engraving step.

7. The method as defined by claim 1, wherein said photosensitive material is photopolyimide.

8. The method as defined by claim 1, wherein said photosensitive material is a solder resist material.

9. The method as defined by claim 1, wherein said photosensitive material is applied by deposition in liquid form to the metal foil.

10. A method of manufacturing a TAB package, comprising: preforming an insulating substrate having an open window therein, fixing a conductive metal foil to the preformed insulating substrate via an adhesive layer, engraving the conductive metal foil to form a TAB lead frame comprising leads each having inside the window of the substrate an inner end adapted for connection to a respective pad of an integrated circuit, and securing to said inner ends insulating frame means of a thickness less than the thickness of said insulating substrate, and having hole means for permitting the connection of the inner ends to the respective pads of the integrated circuit.

11. The method as defined by claim 10, wherein the securing step is conducted before said engraving step at a place corresponding to a location where said inner ends are to be formed.

12. The method as defined by claim 10, wherein said hole means in said insulating frame means are through holes corresponding to the respective inner ends of the TAB lead frame.

13. The method as defined by claim 10, wherein said securing step comprises a gluing step.

14. The method as defined by claim 10, wherein said securing step comprises a direct connection of the inner ends to the insulating frame means.

15. A method of manufacturing a TAB package, comprising: preforming an insulating substrate having an open window therein, fixing a conductive metal foil to the preformed insulating substrate via an adhesive layer, engraving the conductive metal foil to form a TAB lead frame comprising leads each having inside the window of the substrate an inner end adapted for connection to a respective pad of an integrated circuit, and securing to said inner ends insulating frame means of a thickness less than the thickness of said insulating substrate.

16. The method as defined by claim 15, further comprising piercing said insulating frame means to permit the connection of said inner ends to said respective pads of the integrated circuit.

17. The method as defined by claim 16, wherein the piercing step comprises forming through holes under each of the respective inner ends of the TAB lead frame.

18. The method as defined by claim 15, wherein the securing step is conducted before said engraving step, at a place corresponding to a location where said inner ends are to be formed.

19. The method as defined by claim 15, wherein said securing step comprises a gluing step.

20. The method as defined by claim 15, wherein said securing step comprises a direct connection of the inner ends to the insulating frame means.

* * * * *